(12) United States Patent
Usujima

(10) Patent No.: US 6,586,264 B2
(45) Date of Patent: Jul. 1, 2003

(54) METHOD OF CALCULATING CHARACTERISTICS OF SEMICONDUCTOR DEVICE HAVING GATE ELECTRODE AND PROGRAM THEREOF

(75) Inventor: Akihiro Usujima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/940,660

(22) Filed: Aug. 29, 2001

(65) Prior Publication Data

US 2002/0142495 A1 Oct. 3, 2002

(30) Foreign Application Priority Data

Mar. 30, 2001 (JP) .......................................... 2001-98788

(51) Int. Cl.⁷ .......................... G01R 31/26; H01L 21/66
(52) U.S. Cl. ............................. 438/14; 438/18; 438/11; 257/48
(58) Field of Search ............................. 438/14, 18, 11; 257/48

(56) References Cited

U.S. PATENT DOCUMENTS

| | | | | |
|---|---|---|---|---|
| 5,329,138 A | * | 7/1994 | Mitani et al. | 257/42 |
| 5,652,151 A | * | 7/1997 | Asada | 437/8 |
| 5,663,076 A | * | 9/1997 | Rostoker et al. | 438/14 |
| 5,734,185 A | * | 3/1998 | Iguchi et al. | 257/336 |
| 5,773,317 A | * | 6/1998 | Wu et al. | 438/17 |
| 6,121,060 A | * | 9/2000 | Kameyama | 438/14 |
| 6,166,558 A | * | 12/2000 | Jiang et al. | 324/769 |
| 6,174,741 B1 | * | 1/2001 | Hansch et al. | 438/14 |
| 6,242,272 B1 | * | 6/2001 | Kumashiro et al. | 438/14 |
| 6,247,162 B1 | * | 6/2001 | Fujine et al. | 716/2 |
| 6,274,449 B1 | * | 8/2001 | Vasanth et al. | 438/305 |
| 6,295,630 B1 | * | 9/2001 | Tamegaya | 716/4 |
| 6,365,422 B1 | * | 4/2002 | Hewett et al. | 438/14 |

FOREIGN PATENT DOCUMENTS

| | | | | |
|---|---|---|---|---|
| JP | 2-137068 | * | 5/1990 | H01L/21/82 |
| JP | 07193229 | * | 12/1993 | H01L/21/336 |

OTHER PUBLICATIONS

Tsuno et al. "Physically–based thresold voltage determination for MOSFET's of all gate lenghts" IEEE Trans. on electron devices vol. 46 No. 7 7/99 pp. 1429–34.*

Zhang et al. "A novel sub–50 nm poly–si gate patterning technolgy" Electrical and Electronic Tech. 2001 TENCON proceedings of IEEE Internat. conference on vol. 2 2001 pp. 841–843.*

Kleiman et al. "Direct channel lenght determination of sub–100 nm MOS devices using scanning capacitance microscopy" 1998 Symposium of VLSI tech. digest of technical papers. IEEE 0–78–03–4700 6/98 pp. 138–139.*

Zhang et al. "A lithography independent gate definition technology for fabricating sub–100nm devices" IEEE 0–7803–6714 6/01 pp. 81–84.*

* cited by examiner

Primary Examiner—Matthew Smith
Assistant Examiner—Granvill D Lee, Jr.
(74) Attorney, Agent, or Firm—Staas & Halsey LLP

(57) ABSTRACT

For a semiconductor device including a gate electrode in an area of part of a surface of a semiconductor substrate, a gate length is determined and to be set as an upper-limit gate length. For a semiconductor device of which a gate length is almost equal to the upper-limit gate length, an impurity implantation condition is determined to calculate a representative impurity concentration distribution. A limit gate length is obtained according to the representative impurity concentration distribution. For a semiconductor device of which a gate length is equal to or greater than the limit gate length and equal to or less than the upper-limit gate length, an impurity concentration distribution of the semiconductor device is calculated according to the representative impurity concentration distribution. Characteristics of the semiconductor device are obtained according to the impurity concentration distribution. This method reduces the period of time to calculate the characteristics of the semiconductor device.

10 Claims, 9 Drawing Sheets

METHOD OF CALCULATING CHARACTERISTICS OF SEMICONDUCTOR DEVICE HAVING GATE ELECTRODE AND PROGRAM THEREOF

This application is based on Japanese Patent Application 2001-098788, filed on Mar. 30, 2001, the entire contents of which are incorporated herein by reference.

BACKGROUND OF THE INVENTION

A) Field of the Invention

The present invention relates to a method of calculating characteristics of a semiconductor device formed on one surface of a semiconductor substrate having a gate electrode formed on part of an area of the surface and a program for conducting calculations to obtain the characteristics.

In the recent semiconductor devices, performance and integration are increasing in an amazing fashion. It is therefore desired to put new high-performance, low-priced semiconductor devices to the market. For this purpose, a simulation technique is used.

B) Description of the Related Art

Referring to FIG. 9, description will be given of a method of calculating characteristics of a semiconductor device in the prior art. In step ST100, gate lengths Lg(1) to Lg(N) of N semiconductor devices are respectively inputted to a simulator. These semiconductors are of the same configuration excepting that the gate length varies therebetween. In step ST101, one is assigned to the variable i. The variable i is used to identify one of the N semiconductor devices.

In step ST102, a process simulation is conducted for a semiconductor device having a gate length Lg(i). Concretely, such process conditions as an ion implantation condition and a thermal treatment condition are inputted to the simulator to calculate a distribution of impurity concentration in the semiconductor substrate. When the process simulation is finished, the processing goes to step ST103.

In step ST103, according to the impurity concentration distribution resultant from the process simulation, a current-voltage characteristic of the semiconductor device is calculated. This calculation is called "device simulation". When the device simulation is completed, control goes to step ST104.

In step ST104, the variable i is incrementally increased by one. In step ST105, the variable i is compared with the number N of the semiconductor devices. If a condition i≦N is satisfied as a result, control returns to step ST102 to execute the process simulation and the device simulation for the semiconductor devices having gate lengths for which the calculation has not been conducted. If the condition i>N is satisfied, the simulation processing is terminated.

In the calculation method of FIG. 9, the process and device simulations are executed for all semiconductor devices for which the calculation is to be conducted. However, since the process simulation takes a long period of time, when the process simulation is repeatedly conducted N times, the overall calculation time becomes quite long.

SUMMARY OF THE INVENTION

It is therefore an object of the present invention to provide a calculation method and a program thereof which can reduce the calculation time required to calculate characteristics of a semiconductor device.

According to one aspect of the present invention, there is provided a method of calculating characteristics of a semiconductor device, comprising the steps of determining a gate length of a semiconductor device including a gate electrode on or above a partial area of a surface of a semiconductor substrate and setting the gate length determined as an upper-limit gate length, determining an impurity implantation condition for a semiconductor device of which a gate length is substantially equal to said upper-limit gate length and calculating a representative impurity concentration distribution of the semiconductor device, obtaining a limit gate length according to said representative impurity concentration distribution, calculating, for a semiconductor device of which a gate length is equal to or greater than said limit gate length and equal to or less than said upper-limit gate length, an impurity concentration distribution of the semiconductor device according to said representative impurity concentration distribution, and obtaining characteristics of the semiconductor device according to the impurity concentration distribution thus calculated.

According to one aspect of the present invention, there is provided a program to be executed by a computer, comprising the processing steps of inputting an upper-limit gate length of a semiconductor device including a gate electrode on or above a partial area of a surface of a semiconductor substrate, inputting an impurity implantation condition, calculating, for a semiconductor device of which a gate length is substantially equal to said upper-limit gate length, a representative impurity concentration distribution under the impurity implantation condition, obtaining a limit gate length according to said representative impurity concentration distribution, obtaining, for a semiconductor device of which a gate length is equal to or greater than said limit gate length and equal to or less than said upper-limit length, an impurity concentration distribution of said semiconductor device according to said representative impurity concentration distribution, and calculating characteristics of said semiconductor device according to the impurity concentration distribution.

Once the limit gate length is obtained, characteristics can be obtained, for a semiconductor device of which a gate length is greater than the limit gate length and is equal to or less than the upper-limit gate length, without calculating the impurity concentration distribution under the impurity implantation condition or the like.

As a result, in a simulation processing to obtain characteristics of many semiconductor devices, the number of process simulations can be reduced. This minimizes the simulation time.

BRIEF DESCRIPTION OF THE DRAWINGS

The objects and features of the present invention will become more apparent from the consideration of the following detailed description taken in conjunction with the accompanying drawings in which.

DESCRIPTION OF THE EMBODIMENTS

Figure 1:
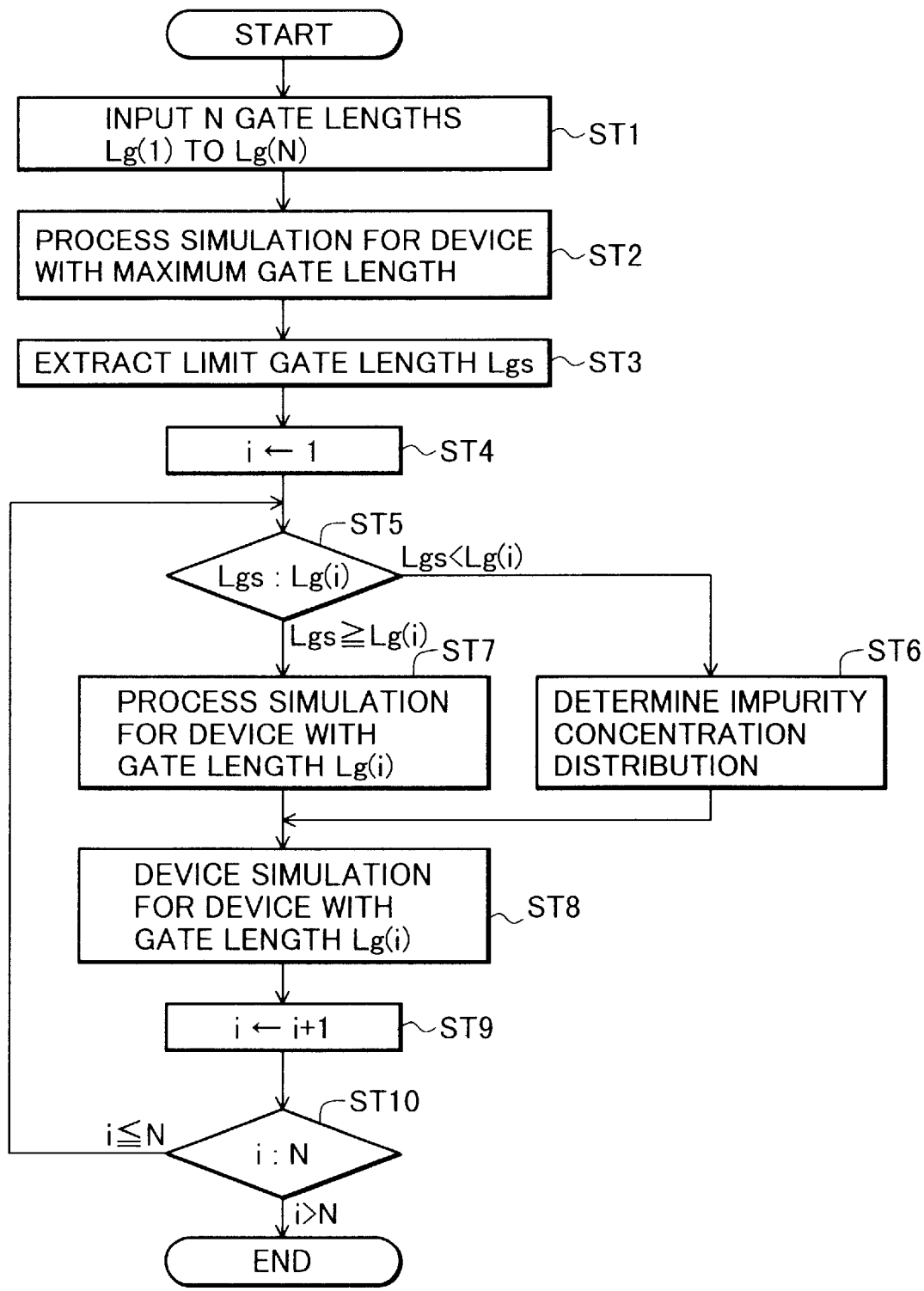
FIG. 1 is a flowchart showing a method of calculating characteristics of a semiconductor device in a first embodiment.

FIG. 1 shows a main flowchart of a method of calculating characteristics of a semiconductor device in a first embodiment. First, in step ST1, gate lengths Lg(1) to Lg(10) of N semiconductor devices of which characteristics are to be calculated are inputted to a simulator. For example, N is set to ten, and Lg(1) to Lg(N) are set respectively to 5 micrometers ($\mu$m), 4 $\mu$m, 3 $\mu$m, 2 $\mu$m, 1 $\mu$m, 0.8 $\mu$m, 0.5 $\mu$m, 0.3 $\mu$m, 0.26 $\mu$m, and 0.24 $\mu$m.

Figure 2A:
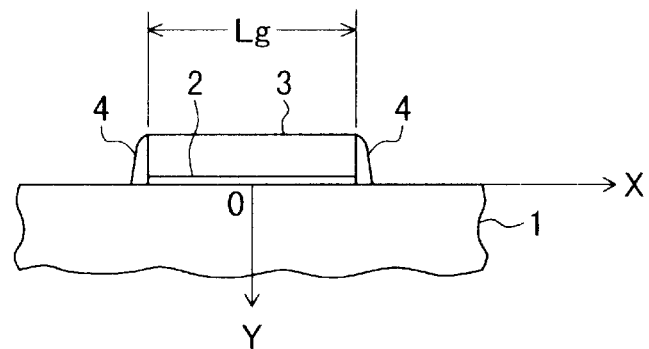
FIG. 2A is a cross-sectional view of a semiconductor device of which characteristics are to be calculated and FIG. 2B is a diagram showing an example of iso-concentration lines of an impurity concentration distribution resultant from a process simulation.

FIG. 2A shows a cross-sectional view of a semiconductor device. In a partial area of a surface of a semiconductor substrate 1, a gate electrode 3 is formed on a gate insulator film 2 disposed between the gate electrode 3 and the substrate 1. On a sidewall of the gate electrode 3, a side wall spacer 4 is formed. Assume that the gate electrode 3 has a gate length Lg. The N semiconductor devices of which characteristics are to be calculated are configured in the same configuration excepting that the gate length varies therebetween. Define an orthogonal coordinate system (x,y) in a plane (corresponding to a surface of the sheet of FIG. 2A) which is perpendicular to the surface of the semiconductor substrate 1 and which is parallel to a gate length direction. An x axis is parallel to the gate length direction and a y axis is perpendicular to the surface of the semiconductor substrate 1. Assume that a central point of the gate electrode 3 is an origin of the x axis, and the surface of the semiconductor substrate 1 is an origin of the y axis, and a direction toward an inner side of the semiconductor substrate 1 is a positive direction of the y axis. The semiconductor device is axially symmetric with respective to the y axis.

In step ST2, a process simulation is conducted for a semiconductor device having a maximum gate length Lgmax, namely, the gate length Lg is 5 $\mu$m. An example of process simulation conditions will now be described. The pertinent semiconductor device is an n-channel metal-oxide semiconductor (NMOS) transistor used in a complementary MOS (CMOS). Since the semiconductor device is axially symmetric with respective to the y axis, the process simulation is conducted only in a positive zone of the x coordinate values in the x-y plane shown in FIG. 2A.

Figure 8:
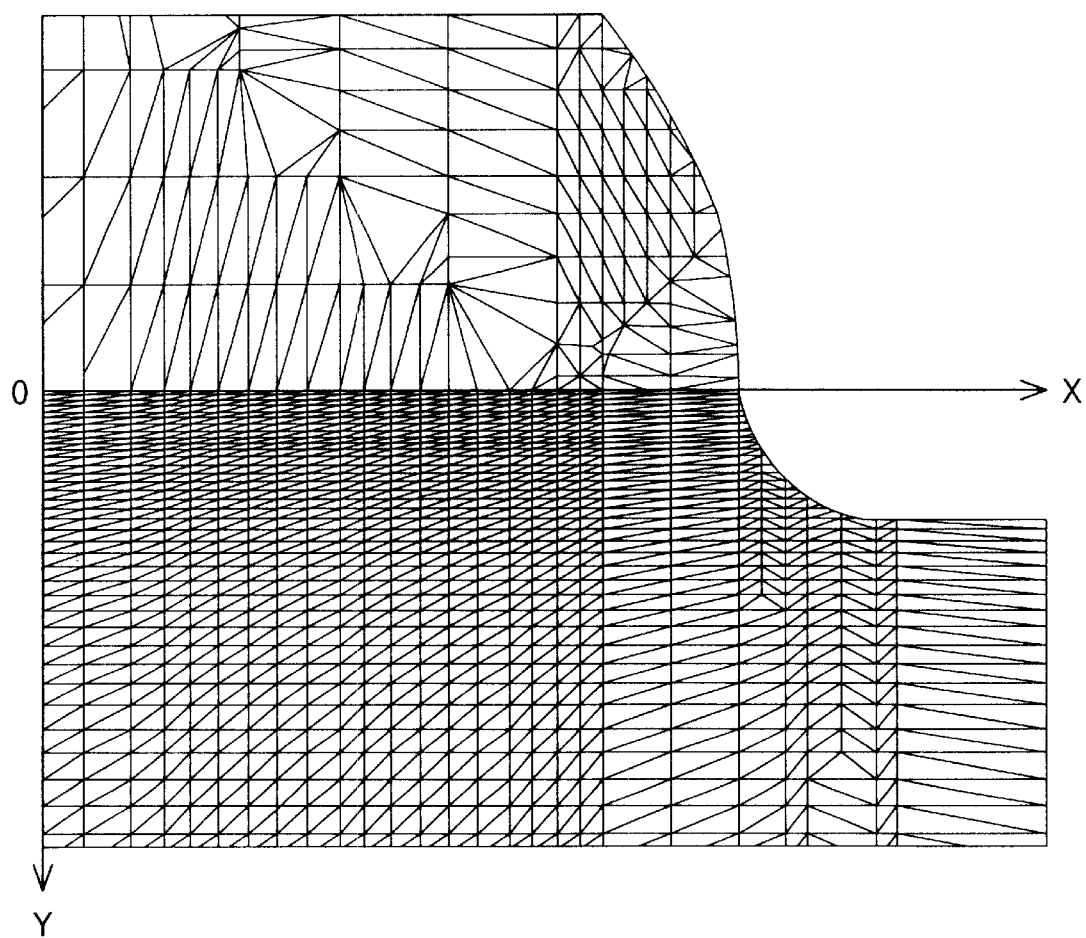
FIG. 8 is a diagram showing meshes used in a process simulation.
Figure 9:
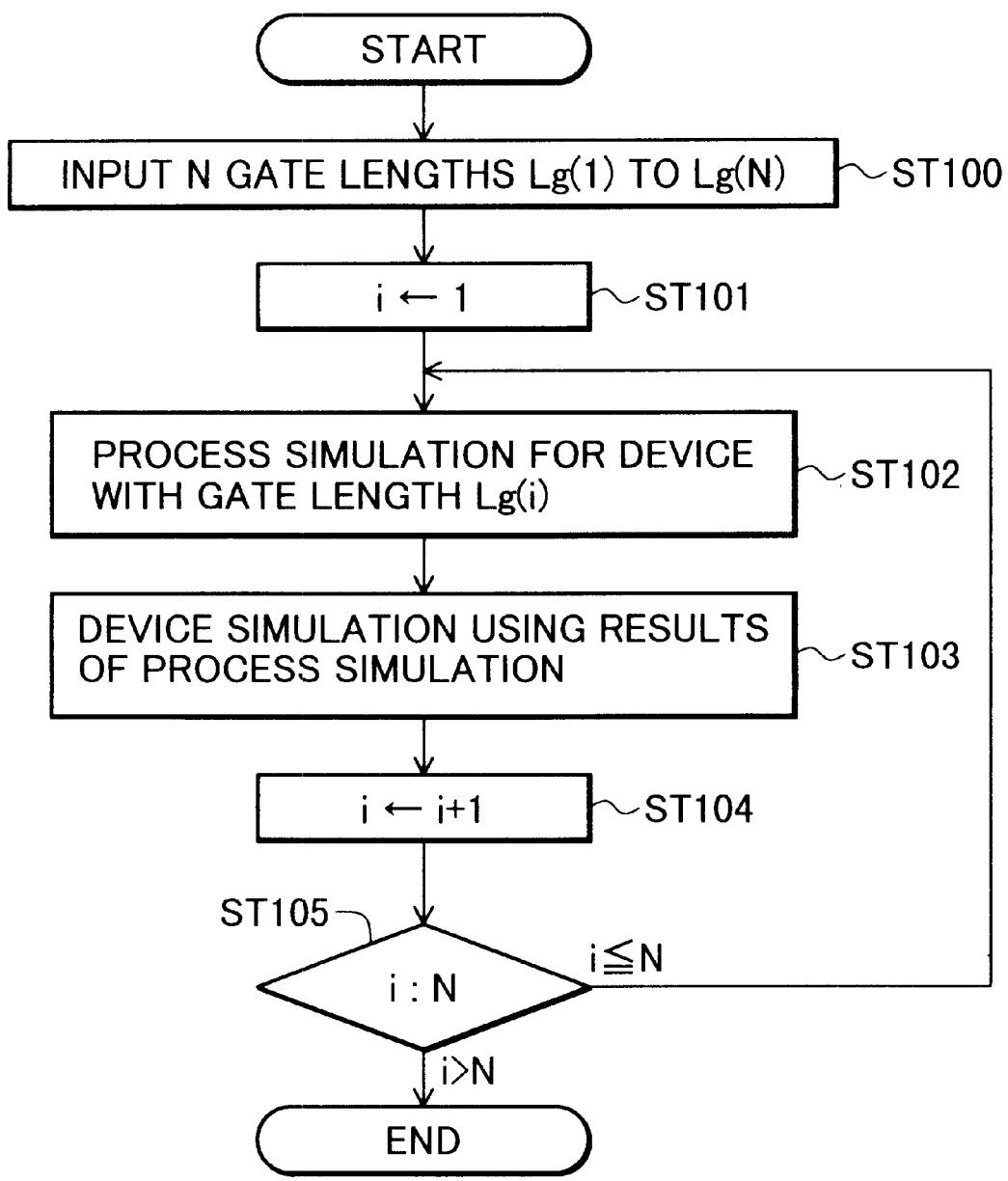
FIG. 9 is a flowchart showing a method of calculating characteristics of a semiconductor device in the prior art.

First, meshes are drawn in the x-y plane for simulation. FIG. 8 shows an example of meshes. The size or interval between meshes is not fixed. That is, in an area in which a change of the impurity concentration is greater, the meshes are more densely drawn. For example, the meshes become less dense as the depth thereof increases in the y-axis direction.

Next, silicon is set as a material of the substrate. Additionally, an ion implantation condition to form a p-type well, an ion implantation condition for channel doping, a gate oxide-film forming condition, and a condition to form a polycrystalline silicon layer are specified. A polycrystalline silicon layer formed under the conditions is patterned to form gate electrodes 3 having ten types of gate lengths explained above:

Next, an ion implantation condition is set to form a source extension region and a drain extension region. After the ion plantation, a side wall spacer 4 is formed on a sidewall of the gate electrode 3. An ion implantation condition to form a deep source and a deep drain and a heat treatment condition for activation are specified. Under the process conditions, a process simulation is conducted to calculate an impurity concentration distribution. The impurity concentration distribution is called "representative impurity concentration distribution".

Figure 2B:
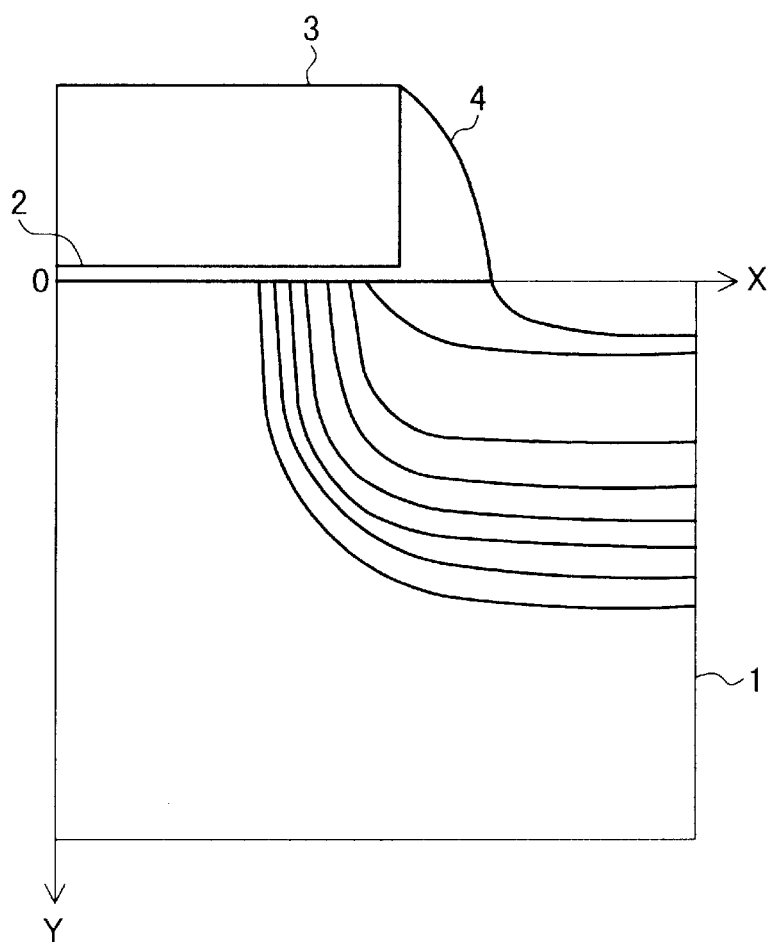

FIG. 2B shows an example of an impurity concentration distribution obtained by calculation. In FIG. 2B, curved lines in the silicon substrate 1 indicate iso-concentration lines.

When the process simulation is finished, control goes to step ST3. In step ST3, a limit gate length Lgs is obtained. A method of calculating the limit gate length Lgs will be described by referring to FIG. 3 and FIGS. 4A to 4D.

Figure 3:
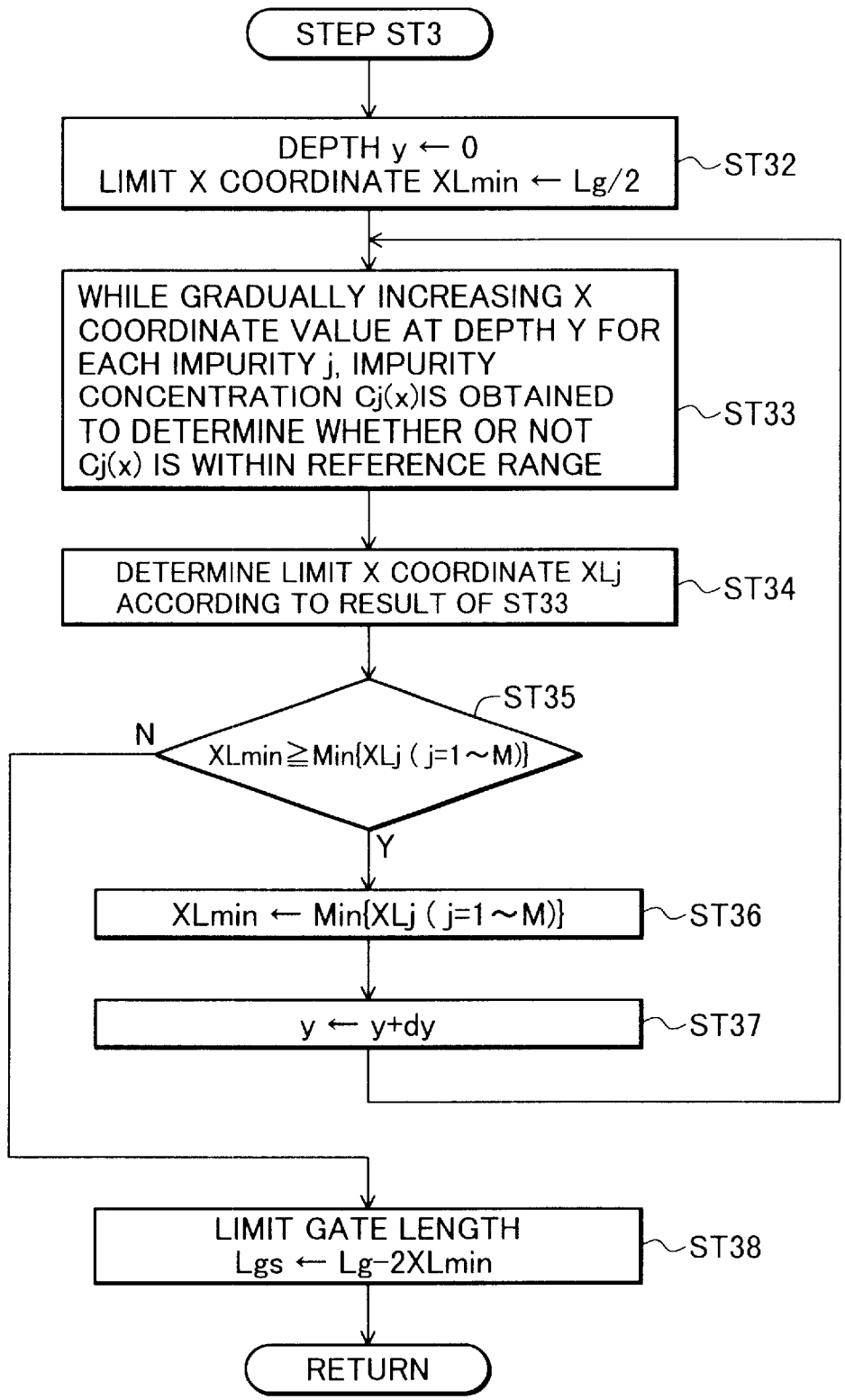
FIG. 3 is a flowchart showing a procedure of the method used to calculate a limit gate length in the first embodiment.
Figure 4A:
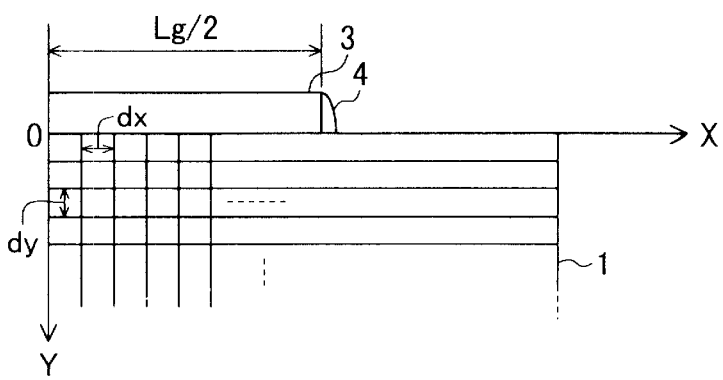
FIG. 4A is a cross-sectional view of a semiconductor device to explain a procedure to calculate a limit gate length.
Figure 4B:
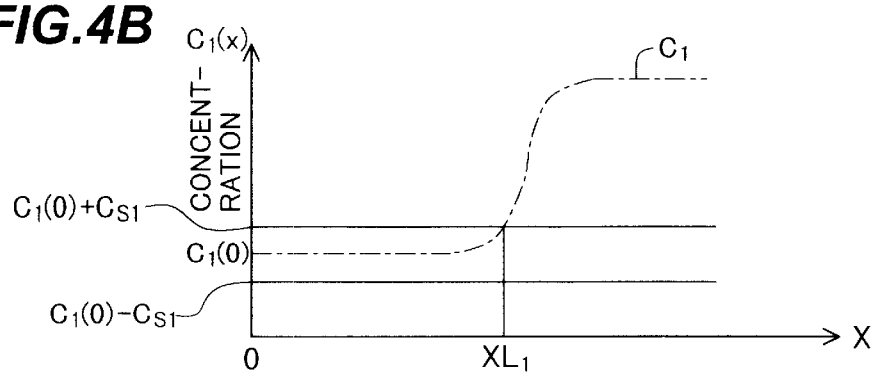
FIGS. 4B to 4D are graphs showing impurity concentration distributions.
Figure 4C:
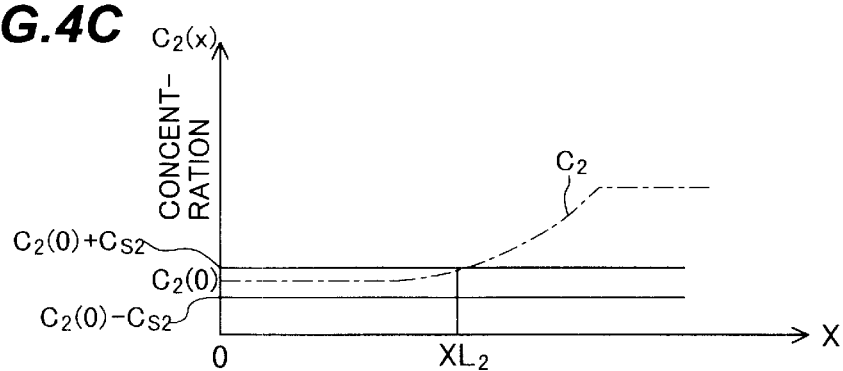
Figure 4D:
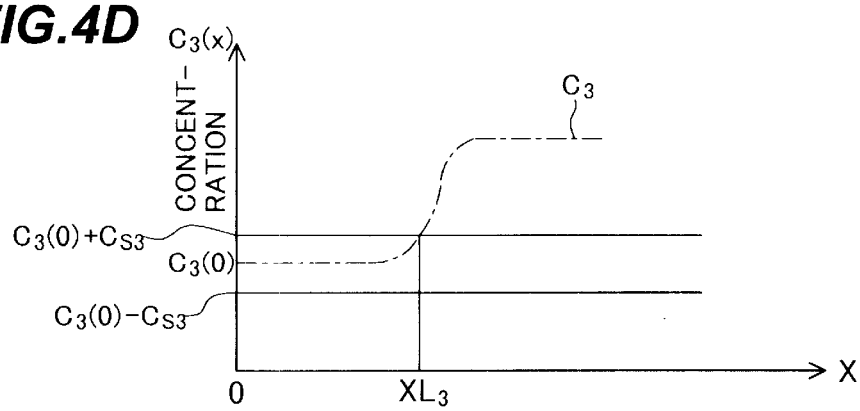

FIG. 3 is a detailed flowchart of the step ST3 of FIG. 1. FIG. 4A shows a cross-sectional view of the semiconductor device in the x-y plane. FIGS. 4B to 4D show impurity concentration distributions of respective impurities j (j=1, 2, 3) in the x-axis direction. FIGS. 4A to 4D will be referred to when necessary in the following description.

First, in step ST32, 0 is assigned to the depth y and Lg/2 is assigned to the limit x coordinate value XLmin. The gate length Lg is beforehand set to the maximum gate length Lgmax in step ST2 of FIG. 1. Therefore, Lg is 5 $\mu$m. After the variables are thus set, the processing goes to step ST33.

Next, description will be given of the procedure of step ST33. First, for each impurity j (j=1, 2, ..., M), the system calculates an impurity concentration distribution at the depth y (y=0 in this case) in the x-axis direction. For example, as shown in FIG. 4A, a value is set to an increment dx as an incrementing value in the x coordinate value. An impurity concentration is calculated at each point (x,y) while incrementally adding dx to the x coordinate value every calculation beginning at x=0. The increment dx is, for example, 0.01 $\mu$m. In step ST2 of FIG. 1, a representative impurity concentration is beforehand obtained for each point of meshes used in the process simulation. The impurity concentration at (x,y) can be easily obtained by interpolating the representative impurity concentration at each point of the meshes.

FIGS. 4B to 4D show examples of impurity concentration of impurities j (j=1, 2, 3). The abscissa represents x coordinate values and the ordinate represents concentration Cj of an impurity j. Assume that for each impurity j, a range of Csj centered on impurity concentration Cj (0) at x=0, namely, Cj(0)±Csj is called "reference range". Csj can be set to, for example, about 10% of Cj(0).

In general, the impurity concentration is almost constant in the vicinity of the central point of the gate electrode 3 and abruptly increases in the vicinity of an edge thereof. When the x coordinate value (0 in the initial state) is gradually increased, the impurity concentration is within the reference range in an initial stage. At a particular x coordinate value, the impurity concentration is beyond the reference range. When the concentration of impurity j is beyond the reference range, the processing goes to step ST34.

In step ST34, the x coordinate value at which the concentration of impurity j is beyond the reference range is determined as a limit x coordinate value XLj. The limit x coordinate value XLj is determined for each impurity j. FIGS. 4B to 4D also show the impurity concentration at x coordinate values exceeding XLj. However, in the actual procedure, once the limit x coordinate value XLj is determined, it is no longer necessary to calculate the impurity concentration in an area of x coordinate values exceeding XLj.

In step ST35, a minimum value of the limit x coordinate values XLj obtained for the respective impurities j is compared with the limit x coordinate value XLmin. When the minimum value of XLj is equal to or less than XLmin, the processing goes to step ST36. Since XLmin is beforehand set to Lg/2 in step ST32, the condition is satisfied in this situation.

In step ST36, the minimum value of XLj is assigned to XLmin. In step ST37, the depth y is incrementally increased by the increment dy shown in FIG. 4A. The increment dy is, for example, 0.01 $\mu$m. Returning to step ST33, the limit x coordinate value XLj is determined at a new depth y.

In step ST35, when the minimum value of XLj is greater than XLmin, control goes to step ST38. In step ST38, the limit gate length Lgs is set to a value obtained by subtracting the double of limit x coordinate value XLmin from the maximum gate length Lgmax. When the limit gate length Lgs is thus set, the processing goes to step ST4 of FIG. 1. When the impurities to be implanted are three kinds of material, namely, boron (B), arsenic (As), and phosphorus (P), the limit x coordinate value XLmin was 2.25 $\mu$m in step ST38. The depth y is 0.13 $\mu$m, and the minimum value of limit x coordinate value XLj is obtained when the impurity j is arsenic. The limit gate length Lgs is 0.5 $\mu$m.

In step ST4 of FIG. 1, one is assigned to the variable i. The variable i is used to identify each of semiconductor devices of which characteristics are to be calculated.

Figure 5:
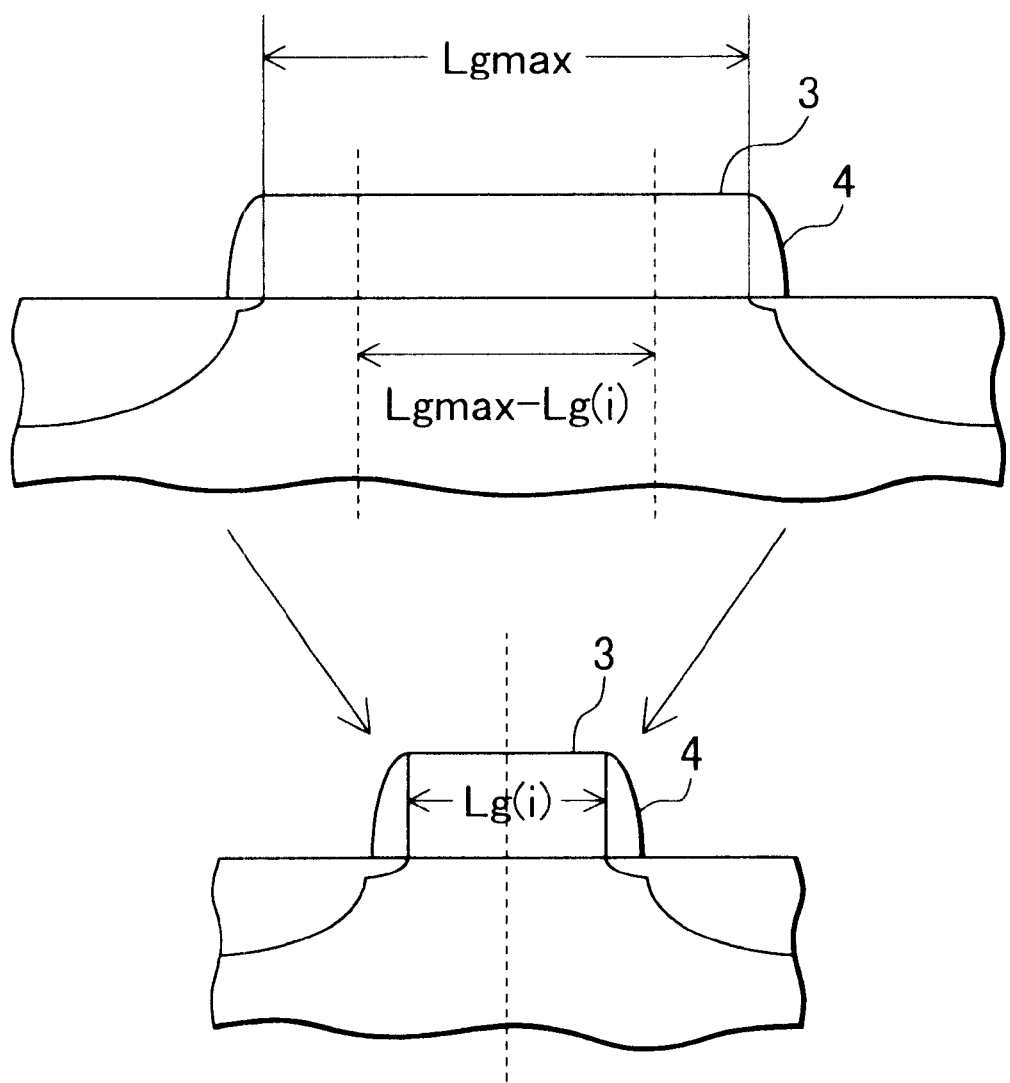
FIG. 5 is a cross-sectional view of a semiconductor device to explain a method of calculating an impurity concentration distribution using a representative impurity concentration distribution.

In step ST5, the limit gate length Lgs is compared with the gate length Lg(i) of the semiconductor device of which a characteristic is to be calculated. When the gate length Lg(i) is greater than the limit gate length Lgs, th processing goes to step ST6. In step ST6, according to a representative impurity concentration distribution, the system determines an impurity concentration distribution for the semiconductor device having the gate length Lg(i). Referring now to FIG. 5, description will be given of a method of determining the impurity concentration distribution.

An upper-half section of FIG. 5 shows a cross-sectional view of a semiconductor device of which the gate length is equal to the maximum gate length Lgmax. The impurity concentration distribution in the semiconductor substrate is substantially equal to the representative impurity concentration distribution calculated in step ST2 of FIG., 1. By removing a central section having a length of Lgmax–Lg(i) of the gate electrode 3 from the semiconductor device and by connecting two remaining sections of the gate electrode 3 to each other, there is formed a semiconductor device with a gate length of Lg(i) as shown in a lower-half section of FIG. 5. The impurity concentration distribution of the semiconductor device can be easily determined using the representative impurity concentration distribution.

The impurity concentration distribution of the removed section of the original semiconductor device varies within the reference range Cj(0)±Csj. Therefore, it can be expected that the impurity concentration distribution of the semiconductor device formed by removing the central section has a precision sufficient to approximate characteristics of the semiconductor device having a gate length of Lg(i).

In step ST8, according to the approximated impurity concentration distribution, the current-voltage characteristic is obtained by simulation. This is called "device simulation".

In step ST9, the variable i is incrementally increased. Instep ST10, the variable i is compared with the number N of the semiconductor devices of which the characteristic is to be calculated. If the variable i is equal to or less than N, the processing returns to step ST5 to calculate the characteristic of a semiconductor device with a new gate length. If the variable i is greater than N, the simulation is terminated.

In step ST5, if the gate length Lg(i) of the pertinent semiconductor device is equal to or less than the limit gate length Lgs, the processing goes to step ST7. In step ST7, a process simulation like that executed in step ST2 is conducted for the semiconductor device with gate length Lg(i). In step ST8, a device simulation is conducted according to a result of the process simulation in step ST7.

In this embodiment, since the limit gate length Lgs is 0.5 $\mu$m, step ST9 is executed for six semiconductor devices of which the gate length Lg ranges from 5 $\mu$m to 0.8 $\mu$m. The process simulation of step ST7 is conducted only for four semiconductor devices of which the gate length Lg is equal to or less than 0.5 $\mu$m. Therefore, the system conducts five process simulations including the process simulation in step ST2. In the prior art, the process simulation must be conducted for each of ten semiconductor devices. By the method of the embodiment, the number of process simulations can be therefore reduced.

Figure 6A:
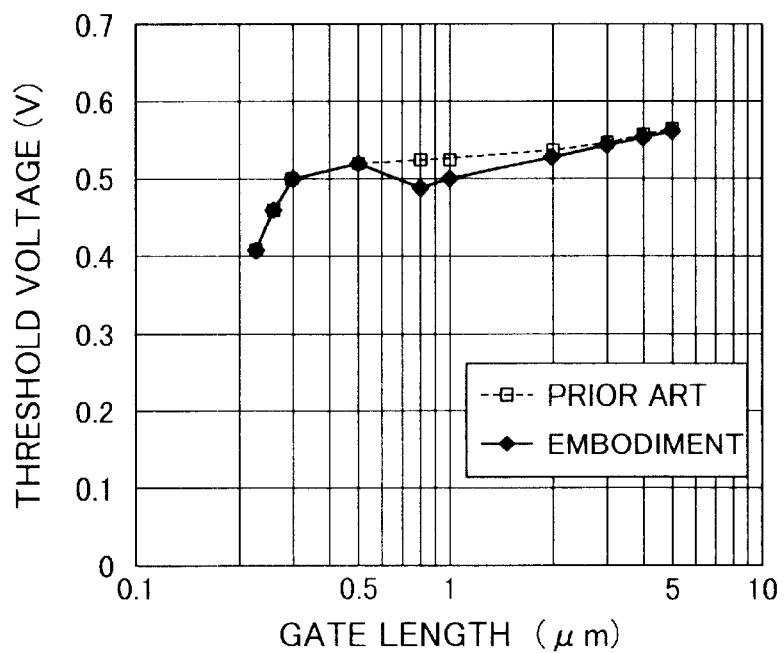
FIG. 6A is a graph showing threshold voltages obtained in an embodiment and in a method of the prior art and FIG. 6B is a graph showing threshold voltages obtained in a comparison example and in a method of the prior art.

FIG. 6A comparatively shows threshold voltages of the semiconductor device obtained in the method of the embodiment and those obtained in the method of the prior art. The abscissa represents the gate length in micrometers ($\mu$m) and the ordinate represents the threshold voltage in volts (V). In FIG. 6A, black rhombuses indicate threshold voltages obtained in the method of the embodiment and open rectangles indicate those obtained in the method of the prior art.

Also in the embodiment, the process simulation is conducted for each of the semiconductor devices of which the gate length Lg is equal to or less than 0.5 $\mu$m and the semiconductor device of which the gate length Lg is 5 $\mu$m. Therefore, the threshold voltages obtained in the method of the embodiment respectively match those obtained in the method of the prior art. For the semiconductor devices of which the gate length Lg ranges from 0.8 $\mu$m to 4 $\mu$m, the threshold voltages are obtained using the impurity concentration distribution calculated in step ST6 of FIG. 1. Therefore, the threshold voltages obtained in the method of the embodiment slightly differ from the associated threshold voltages obtained in the method of the prior art. However, the difference is quite small therebetween.

In the operation using the method of the prior art, the central processing unit (CPU) is used for 36.5 hours. In contrast therewith, the CPU is used for 16.2 hours in the operation in the method of the embodiment. By using the method of the embodiment, the period of time in which the CPU is used for the operation can be therefore reduced.

Figure 6B:
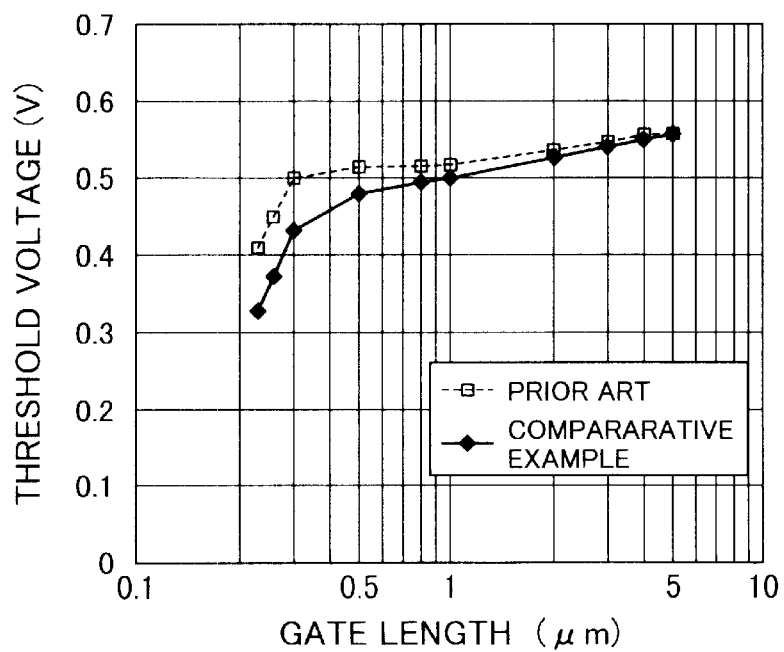

FIG. 6B comparatively shows threshold voltages of the semiconductor device obtained in the method of a comparative example according to the impurity concentration distribution obtained in almost the same method as for step ST6 of FIG. 1 and those obtained in the example of the prior art. Black rhombuses indicate threshold voltages obtained in the method of the comparative example and open rectangles indicate those obtained in the example of the prior art. For the gate length equal to or less than 0.5 μm, the threshold voltages of the comparative example greatly vary from the associated threshold voltages obtained in the method of the prior art. By the method of the embodiment, the difference can become smaller.

Figure 7:
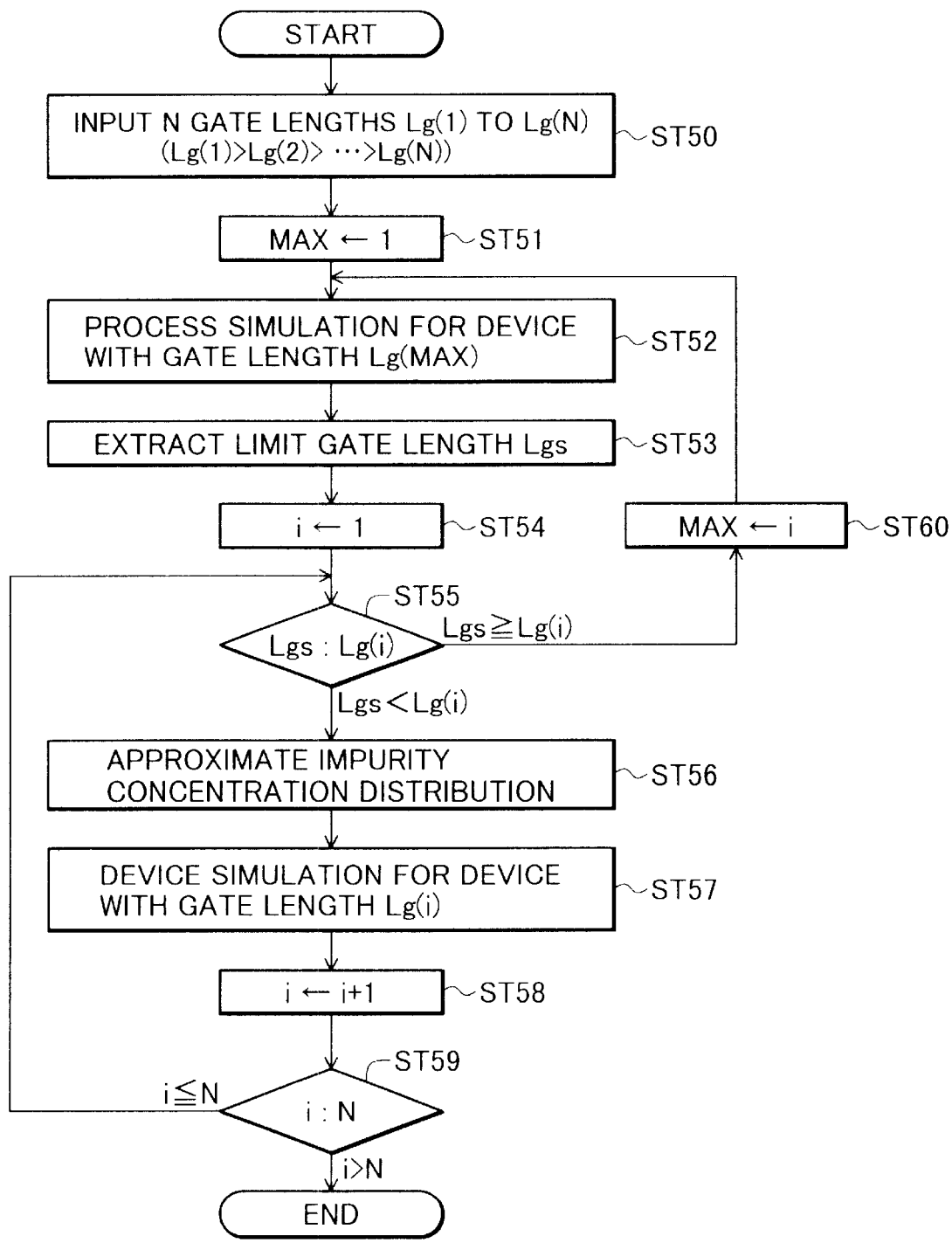
FIG. 7 is a flowchart showing a method of calculating characteristics of a semiconductor device in a second embodiment.

Referring next to FIG. 7, description will be given of a method of calculating characteristics of a semiconductor device in a second embodiment.

In step ST50, gate lengths Lg(1) to Lg(N) of N semiconductor devices are inputted to the simulator, where Lg(1)>Lg(2)>. . . >Lg(N). In step ST51, one is assigned to a variable MAX. The variable MAX is used to identify a semiconductor device having a largest gate length among the semiconductor devices of which the characteristic is to be calculated.

In step ST52, a process simulation similar to that of step ST2 of FIG. 1 is conducted for a semiconductor device having the gate length Lg(MAX). In step ST53, a limit gate length Lgs is obtained according to a result of the process simulation. The processing of step ST53 is executed in a method almost same as that shown in FIG. 3.

In step ST54, one is assigned to the variable i. The variable i is used to identify a semiconductor device of which the characteristic is to be calculated. In step ST55, the limit gate length Lgs is compared with the gate length Lg(i) of the pertinent semiconductor device. If the gate length Lg(i) exceeds the limit gate length Lgs, the processing goes to step ST56.

In step ST56, an impurity concentration distribution is calculated in the same way as in step ST6 of FIG. 1. To calculate the impurity concentration distribution, the representative impurity concentration distribution obtained in step ST52 is used. In step ST57, a device simulation is conducted for a semiconductor device having the gate length Lg(i). In step ST58, the variable i is incrementally increased.

In step ST59, the variable i is compared with the number N that is the number of the pertinent semiconductor devices of which the characteristics are to be calculated. If the variable i is equal to or less than N, control returns to step ST55. If the variable i is greater than N, the simulation is terminated.

The procedure from step ST55 to step ST59 is substantially equal to the procedure of steps ST5, ST6, ST8, ST9, and ST10 of FIG. 1. In step ST55, if the gate length Lg(i) is equal to or less than the limit gate length Lgs, namely, if the impurity concentration distribution obtained using the representative impurity concentration distribution is not suitable for the calculation of the characteristic of the semiconductor, the processing goes to step ST60.

In step ST60, the value of i is assigned to the variable MAX and then control returns to step ST52. In step ST52, a process simulation is conducted for a semiconductor device having the gate length Lg(i) to calculate the impurity concentration distribution again.

In step ST53, the limit gate length Lgs is newly calculated according to the impurity concentration distribution thus obtained. Using the limit gate length Lgs as a new reference, a device simulation is conducted for a semiconductor device having a gate length exceeding the limit gate length Lgs.

While the process simulation is conducted for all semiconductor devices having a gate length exceeding the limit gate length Lgs in the first embodiment, the number of simulations can be reduced by resetting or by setting again the limit gate length Lgs in the second embodiment.

In the first and second embodiments, the depth y is increased only by the increment dy in step ST37 of FIG. 3. That is, the increment dy in the y-axis direction is fixed in FIG. 4A. However, the increment dy need not be necessarily fixed. For example, the depth y for which the impurity concentration is calculated in step ST33 of FIG. 3 may be set to the position of a mesh used in the process simulation of FIG. 8. Additionally, the x coordinate value for which the impurity concentration distribution is calculated in step ST33 may be set to a position of a mesh of FIG. 8.

As above, when a point indicated by the coordinates for which the impurity concentration is calculated in step ST33 is set to a position of a mesh used in the process simulation, the impurity concentration can be obtained directly from the result of the process simulation without conducting the interpolation in step ST33.

In the first and second embodiments, the limit x coordinate XLj is obtained according to the impurity concentration distribution in step ST34 of FIG. 3. However, the limit x coordinate XLj may be obtained using a net doping quantity in place of the impurity concentration distribution. In this case, the net doping quantity is calculated as a total amount of a plurality of impurities doped, and then a check is made to determine whether or not the net doping quantity is within the reference range.

In this method, since only one limit x coordinate value is determined for a given depth, it is not required in step ST35 to obtain the minimum value among the limit x coordinate values.

Description has been given of a method of calculating characteristics of a semiconductor device in the embodiments. It is also possible to easily create a computer program to achieve the method.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What we claim are:

1. A method of calculating characteristics of a semiconductor device, comprising the steps of:

determining a gate length of a semiconductor device including a gate electrode on or above a partial area of a surface of a semiconductor substrate and setting the gate length determined as an upper-limit gate length;

determining an impurity implantation condition for a semiconductor device of which a gate length is substantially equal to said upper-limit gate length and calculating a representative impurity concentration distribution of the semiconductor device;

obtaining a limit gate length according to said representative impurity concentration distribution;

determining, for a semiconductor device of which a gate length is equal to or greater than said limit gate length and equal to or less than said upper-limit gate length, an impurity concentration distribution of the semiconductor device according to said representative impurity concentration distribution; and obtaining characteristics of the semiconductor device according to the impurity concentration distribution thus determined.

2. A method of calculating characteristics of a semiconductor device according to claim 1, wherein when an x-y coordinate system is introduced to a cross-sectional plane vertical to said surface of the semiconductor substrate and parallel to a direction of the gate length in which an x axis is parallel to the gate length direction and has an origin at a central point of said gate electrode and a y axis has an origin on said surface of the semiconductor substrate and has a positive direction extending toward an inside of said semiconductor substrate, said limit gate length obtaining step comprises:
a first step of determining at a given position indicated by a y coordinate value whether or not an impurity concentration at each of a plurality of points on a virtual straight line parallel to the x axis is within a reference range;
a second step of determining a limit x coordinate value according to a result of the determination in the first step; and
a third step of determining said limit gate length according to said limit x coordinate value.

3. A method of calculating characteristics of a semiconductor device according to claim 2, wherein
said first step comprises the steps of:
repeatedly executing the determination while gradually increasing the x coordinate value; and
transferring control to said second step when the impurity concentration at the x coordinate value is beyond said reference range, and
said second step includes the step of determining said limit x coordinate value according to the x coordinate value at a point of time when control is transferred thereto.

4. A method of calculating characteristics of a semiconductor device according to claim 2, further comprising the steps of:
repeatedly executing said first and second steps while gradually increasing the y coordinate value until the limit x coordinate value at a second position of the y coordinate value is greater than the limit x coordinate value at a first position of the previous y coordinate value, said first position being immediately before said second position; and
transferring control to said third step when the limit x coordinate value at the second position is greater than the limit x coordinate value at the first position, wherein
said third step determines said limit gate length according to the limit x coordinate value at the first position.

5. A method of calculating characteristics of a semiconductor device according to claim 2, further comprising, when a plurality of impurities are implanted into said semiconductor substrate, the steps of:
obtaining said representative impurity concentration distribution for each of the impurities; and
conducting said first and second steps to obtain the limit x coordinate value, wherein
said third step determines said limit gate length according to a smallest one of the limit x coordinate values of the respective impurities.

6. A method of calculating characteristics of a semiconductor device according to claim 2, wherein said reference range is determined according to an impurity concentration at a position at which the x coordinate value is 0, said range including said impurity concentration.

7. A method of calculating characteristics of a semiconductor device according to claim 1, wherein when a plurality of impurities are implanted into said semiconductor substrate, the step of obtaining said limit gate length comprises the step of obtaining said limit gate length according to a net doping quantity calculated using a plurality of impurity concentration values.

8. A method of calculating characteristics of a semiconductor device according to claim 7, wherein when an x-y coordinate system is introduced to a cross-sectional plane vertical to said surface of the semiconductor substrate and parallel to a direction of the gate length in which an x axis is parallel to the gate length direction and has an origin at a central point of said gate electrode and a y axis has an origin on said surface of the semiconductor substrate and has a positive direction extending toward an inside of said semiconductor substrate, said limit gate length obtaining step comprises:
a step of calculating, at a position indicated by a y coordinate value, a net doping quantity at each of a plurality of points on a virtual straight line parallel to the x axis;
a step of determining whether or not the net doping quantity thus calculated for each point is within a reference range;
a step of determining a limit x coordinate value according to a result of the determination; and
a step of determining said limit gate length according to said limit x coordinate value.

9. A program to be executed by a computer, comprising the processing steps of:
inputting an upper-limit gate length of a semiconductor device including a gate electrode on or above a partial area of a surface of a semiconductor substrate;
inputting an impurity implantation condition;
calculating, for a semiconductor device of which a gate length is substantially equal to said upper-limit gate length, a representative impurity concentration distribution under the impurity implantation condition;
obtaining a limit gate length according to said representative impurity concentration distribution;
obtaining, for a semiconductor device of which a gate length is equal to or greater than said limit gate length and equal to or less than said upper-limit length, an impurity concentration distribution of said semiconductor device according to said representative impurity concentration distribution; and
calculating characteristics of said semiconductor device according to the impurity concentration distribution.

10. A program according to claim 9, wherein when an x-y coordinate system is introduced to a cross-sectional plane vertical to said surface of the semiconductor substrate and parallel to a direction of the gate length in which an x axis is parallel to the gate length direction and has an origin at a central point of said gate electrode and a y axis has an origin on said surface of the semiconductor substrate and has a positive direction extending toward an inside of said semiconductor substrate, said limit gate length obtaining processing step comprises:
a first processing step of determining, at a given position indicated by a y coordinate value, whether or not an impurity concentration or a net doping quantity at each of a plurality of points on a virtual straight line parallel to the x axis is within a reference range;
a second step of determining a limit x coordinate value according to a result of the determination in the first step; and
a third step of determining said limit gate length according to said limit x coordinate value.

* * * * *